(12) United States Patent
Qiao et al.

(10) Patent No.: US 10,594,280 B2
(45) Date of Patent: Mar. 17, 2020

(54) METHOD AND DEVICE FOR GENERATING RECEIVED SIGNAL STRENGTH INDICATION

(71) Applicant: Silergy Semiconductor Technology (Hangzhou) LTD, Hangzhou, ZheJiang Province (CN)

(72) Inventors: Junjie Qiao, Hangzhou (CN); Ran Li, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 40 days.

(21) Appl. No.: 15/668,891

(22) Filed: Aug. 4, 2017

(65) Prior Publication Data
US 2018/0048275 A1    Feb. 15, 2018

(30) Foreign Application Priority Data

Aug. 12, 2016 (CN) .......................... 2016 1 0664076

(51) Int. Cl.
| | | |
|---|---|---|
| *H03G 3/00* | (2006.01) | |
| *H04W 52/24* | (2009.01) | |
| *H04B 17/318* | (2015.01) | |
| *H04B 1/16* | (2006.01) | |
| *H04W 52/22* | (2009.01) | |

(52) U.S. Cl.
CPC .............. *H03G 3/001* (2013.01); *H04B 1/16* (2013.01); *H04B 17/318* (2015.01); *H04W 52/226* (2013.01); *H04W 52/245* (2013.01)

(58) Field of Classification Search
CPC ........ H04B 17/318; H04B 17/21; H04B 1/16; H04B 1/1027; H04W 25/245; H04W 52/226; H04W 52/245; H03G 3/001; H03G 3/3052; H03G 3/20
USPC ......................................................... 455/226.2
See application file for complete search history.

(56) References Cited

U.S. PATENT DOCUMENTS

| | | | | |
|---|---|---|---|---|
| 6,006,077 A | * | 12/1999 | Shull .................... | H04B 17/318 455/226.2 |
| 8,520,721 B2 | | 8/2013 | Myers et al. | |
| 9,414,305 B2 | | 8/2016 | Pankajakshan et al. | |
| 9,520,955 B2 | * | 12/2016 | Li ........................ | H04B 17/318 |
| 9,599,699 B2 | | 3/2017 | Zeng et al. | |
| 2007/0129034 A1 | * | 6/2007 | Adams ................. | H03G 3/3068 455/138 |
| 2009/0156148 A1 | * | 6/2009 | Lee ...................... | H04B 17/318 455/226.2 |
| 2012/0235579 A1 | | 9/2012 | Chemel et al. | |

* cited by examiner

*Primary Examiner* — Betsy Deppe
(74) *Attorney, Agent, or Firm* — Michael C. Stephens, Jr.

(57) ABSTRACT

A method can include: generating a first compensation value based on a receiving frequency, where the first compensation value represents attenuations of a wireless signal at different receiving frequencies during transmission to an analog receiving circuit; generating a second compensation value based on an automatic gain control coefficient, where the second compensation value represents gain errors corresponding to different automatic gain control coefficients; and generating a received signal strength indication based on the first and second compensation values, an intermediate frequency signal strength, and a gain of the intermediate frequency signal with respect to a received signal.

10 Claims, 4 Drawing Sheets

METHOD AND DEVICE FOR GENERATING RECEIVED SIGNAL STRENGTH INDICATION

RELATED APPLICATIONS

This application claims the benefit of Chinese Patent Application No. 201610664076.3, filed on Aug. 12, 2016, which is incorporated herein by reference in its entirety.

FIELD OF THE INVENTION

The present invention generally relates to the field of wireless communications, and more particularly to methods and devices for generating a received signal strength indication (RSSI).

BACKGROUND

RSSI is a signal strength indication of a wireless communication system. In a typical wireless communication system, particularly in a short-distance wireless communication system (e.g., wireless local area network (WLAN), Zigbee system, Bluetooth system, etc.), the distance between a signal receiver and a signal transmitter can be measured based on RSSI. In the presence of multiple signal transmitters, the signal receiver can calculate the distance from each signal transmitter based on the RSSI, in order to realizing positioning.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

The accuracy of received signal strength indication (RSSI) is critical to positioning, controlling, and scheduling of the associated wireless communication system. In one embodiment, a device can include: (i) a first compensation generating circuit configured to generate a first compensation value based on a receiving frequency, where the first compensation value represents attenuations of a wireless signal at different receiving frequencies during transmission to an analog receiving circuit; (ii) a second compensation generating circuit configured to generate a second compensation value based on an automatic gain control coefficient, where the second compensation value represents gain errors corresponding to different automatic gain control coefficients; and (iii) a received signal strength indication generating circuit configured to generate a received signal strength indication based on the first and second compensation values, an intermediate frequency signal strength, and a gain of an intermediate frequency signal with respect to a received signal.

Figure 1:
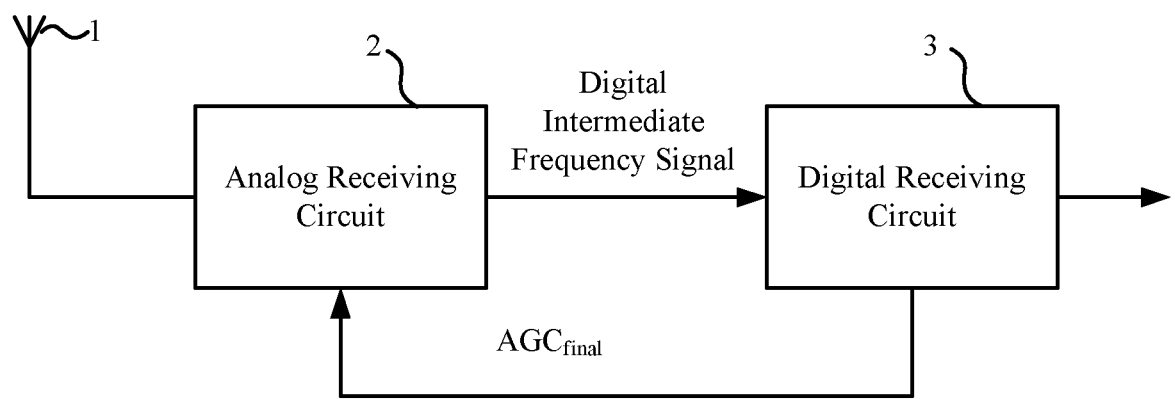
FIG. 1 is a schematic block diagram of an example wireless receiver, in accordance with embodiments of the present invention.

Referring now to FIG. 1, shown is a schematic block diagram of an example wireless receiver, in accordance with embodiments of the present invention. In this particular example, the wireless receiver can include antenna 1, analog receiving circuit 2, and digital receiving circuit 3. Antenna 1 can receive a wireless signal in a predetermined frequency band, may convert the wireless signal into a radio frequency signal, and then transmit the radio frequency signal to analog receiving circuit 2. Analog receiving circuit 2 can process the received signal by various operations (e.g., amplification, filter, down-conversion, analog-to-digital conversion [ADC], etc.), and may generate a digital intermediate frequency signal. The digital intermediate frequency signal may be suitable to be accurately processed by a digital circuit.

Digital receiving circuit 3 can receive the digital intermediate frequency signal, and may acquire data included in the wireless signal by performing various operations (e.g., demodulation, decoding, etc.) on the digital intermediate frequency signal. In addition, digital receiving circuit 3 may also perform automatic gain control (AGC) based on the strength of the digital intermediate frequency signal. For example, digital receiving circuit 3 can generate an automatic gain control coefficient according to the amplitude of the digital intermediate frequency signal. The automatic gain control coefficient may be fed back to analog receiving circuit 2 for controlling the signal amplification gain. Thus, a closed loop of the automatic gain control may be formed in order to amplify the received signal by an appropriate gain by analog receiving circuit 2.

The automatic gain control coefficient can actually represent a digitized signal of a gain, rather than an actual gain. In an ideal state, the signal gain of analog receiving circuit 2 may accordingly increase or decrease by predetermined gain "Gain" for each increase or decrease of the automatic gain control coefficient. For example, when the automatic gain control coefficient is 1, the corresponding gain is Gain, and when automatic gain control coefficient is 2, the corresponding gain is 2*Gain, and so on. When starting the process of receiving data, the automatic gain control loop may be stabilized after a period of time. Then, the automatic gain control coefficient may be denoted as $AGC_{final}$ after the system is stabilized. Thus, the gain of analog receiving circuit 2 with respect to the received signal may be $AGC_{final}*Gain$.

Digital receiving circuit 3 can receive the digital intermediate frequency signal (e.g., a signal generated by amplifying the received signal by $AGC_{final}*Gain$). Therefore, a value that represents the strength of the received signal, i.e., the received signal strength indication (RSSI) can be generated. When the power is in milliwatts or watts, the gain may be calculated in multiple terms. The power of the digital intermediate frequency signal can be divided by $AGC_{final}*Gain$ to generate the power of the received signal, which can be further processed to generate the corresponding RSSI. Alternatively, the power of the digital intermediate frequency signal may be converted to a digital intermediate frequency signal strength rssi_dig in dBm, and $AGC_{final}*Gain$ can be denoted as gain rssi_v of the analog intermediate frequency signal with respect to the received signal. Gain rssi_v of the intermediate frequency signal with respect to the received signal may be subtracted from the digital intermediate frequency signal, in order to generate the RSSI. That is, RSSI=rssi_dig−rssi_v.

However, the wireless signal may be attenuated during the process of being received by the antenna and further transmitted to analog receiving circuit 2. In addition, the characteristics of an amplification circuit itself in analog receiving circuit 2 may not be fully linear. As a result, the gains corresponding to the different automatic gain control coefficients may not be fully linear, and may have certain errors. Thus in particular embodiments, the received signal strength indication may be further processed in order to compensate for such attenuation and possible errors.

For example, the attenuation of the wireless signal generated during the transmission from antenna 1 to the analog receiving circuit may be independent of the signal content, but related to receiving frequency fi (also referred to as the receiving channel). Thus, compensation value "offset" related to the attenuations can be generated based on receiving frequency $f_i$. Compensation value offset can represent attenuations of the wireless signal at different receiving frequencies during the transmission to the analog receiving circuit. A correspondence table that represents the relationship of the attenuations and the receiving frequencies or channels can be predetermined by experimental measurement or advance simulation calculations. Digital receiving circuit 3 can generate compensation value offset corresponding to the present receiving frequency by looking up the correspondence table based on the current receiving frequency, channel, or by matrix calculation. That is, compensation offset can be calculated by following formula (1).

$$offset = \begin{bmatrix} offset_1 \\ offset_2 \\ ... \\ offset_n \end{bmatrix} f_i \quad (1)$$

For example, $offset_i$ represents the attenuations at different receiving frequencies, and $f_i$ represents the frequency band to which the current frequency belongs or the frequency matrix, as shown below in formula (2).

$$f_i = \begin{bmatrix} f_1 \\ f_2 \\ ... \\ f_n \end{bmatrix} = \begin{bmatrix} 1 & ... & 0 \\ \vdots & \ddots & \vdots \\ 0 & ... & 1 \end{bmatrix} \quad (2)$$

The error amplified by analog receiving circuit 2 based on the automatic gain control coefficient may be independent of the signal content, but related to the automatic gain control coefficient. That is, different errors may correspond to different automatic gain control coefficients. Therefore, compensation value offset_agc may be generated based on the automatic gain control coefficient. Compensation value offset_agc can represent gain errors that correspond to different automatic gain control coefficients, and a correspondence table that represents the relationship of the gain errors (e.g., Compensation values offset_agc) and the automatic gain control coefficients may be predetermined, such as by experimental measurement or advance simulation calculations. Digital receiving circuit 3 can generate compensation value offset_agc that corresponds to the current automatic gain control coefficient by looking up the correspondence table according to the automatic gain control coefficient generated by the automatic gain control unit, or by matrix calculation. That is, compensation value offset_agc can be calculated as shown below in formula (3).

$$offset\_agc = \begin{bmatrix} offset\_agc_1 \\ offset\_agc_2 \\ ... \\ offset\_agc_m \end{bmatrix} AGC_I \quad (3)$$

For example, $offset\_agc_i$ represents the errors corresponding to different automatic gain control coefficients, and $AGC_I$ represents the automatic gain control matrix, as shown below in formula (4).

$$AGC_I = \begin{bmatrix} AGC_1 \\ AGC_2 \\ ... \\ AGC_m \end{bmatrix} = \begin{bmatrix} 1 & ... & 0 \\ \vdots & \ddots & \vdots \\ 0 & ... & 1 \end{bmatrix} \quad (4)$$

Received signal strength indication RSSI can be generated based on compensation value offset and compensation value offset_agc, and intermediate frequency signal strength rssi_dig and gain rssi_v of the intermediate frequency signal with respect to the received signal. For example, the intermediate frequency signal strength can be measured in dBm, and the received signal strength indication RSSI can be calculated by formula (5) below. One skilled in the art will recognize that accurate RSSI can be generated by using other formulas when RSSI may be employed in other forms.

RSSI=rssi_dig−rssi_v+offset+offset_agc (5)

In one embodiment, a method can include: (i) generating a first compensation value based on a receiving frequency, where the first compensation value represents attenuations of a wireless signal at different receiving frequencies during transmission to an analog receiving circuit; (ii) generating a second compensation value based on an automatic gain control coefficient, where the second compensation value represents gain errors corresponding to different automatic gain control coefficients; and (iii) generating a received signal strength indication based on the first and second compensation values, an intermediate frequency signal strength, and a gain of the intermediate frequency signal with respect to a received signal.

Figure 2:
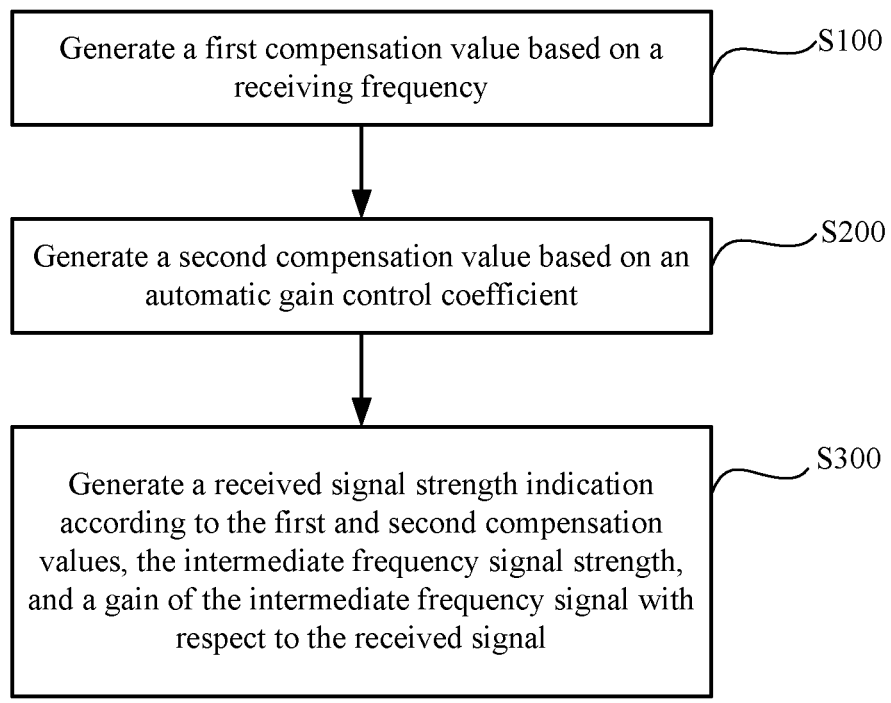
FIG. 2 is a flow diagram of an example method of generating a received signal strength indication, in accordance with embodiments of the present invention.

Referring now to FIG. 2, shown is a flow diagram of an example method of generating a received signal strength indication, in accordance with embodiments of the present invention. In this particular example, at S100, a first compensation value (e.g., offset) can be generated based on a receiving frequency. The relationship of the first compensation value and the receiving frequency may be set in advance. At S200, a second compensation value (e.g., offset_agc) can be generated based on an automatic gain control coefficient. The relationship of the second compensation value and the automatic gain control coefficient generated by the automatic gain control loop may be set in advance. It should be understood that the order of steps S100 and S200 can be performed in succession, or may overlap in time, and in some cases step S200 may be performed prior to step S100.

At S300, a received signal strength indication can be generated based on compensation values offset and offset_agc, an intermediate frequency signal strength, and a gain of an intermediate frequency signal with respect to the received signal. Therefore, the attenuations of a radio frequency signal and possible errors of the automatic gain control loop can be compensated by compensation values offset and offset_agc, in order to improve the generating accuracy of the RSSI. In addition, strength rssi_dig of the digital intermediate frequency signal can be acquired based on the power of the intermediate frequency signal. For example, the digital intermediate frequency signal can be represented as below in formula (6).

$$S(t)=Ae^{j2\pi ft}=I+jQ \quad (6)$$

For example, A represents the amplitude of a modulation signal, $e^{j2\pi ft}$ is a complex expression form of a carrier wave (e.g., exponential form), and f represents the intermediate frequency. I+jQ is another complex expression form (e.g., algebraic form), where I is the real part that represents an in-phase component, and Q is the imaginary part that represents a quadrature component. Therefore, power P of the digital intermediate frequency signal can be calculated as below in formula (7).

$$P=I^2+Q^2 \quad (7)$$

In one example, power P of the digital intermediate frequency signal can be converted to a corresponding digital intermediate frequency signal strength with reference to a look-up table. The corresponding digital intermediate frequency signal strength in different power ranges can be set in advance. Thus, the corresponding digital intermediate frequency signal strength rssi_dig can be generated based on the power range of the digital intermediate frequency signal. That is, the digital intermediate frequency signal strength can be generated by formula (8) below.

$$\text{rssi\_dig} = \begin{cases} \text{rssi\_dig}_1, & P_0 < P < P_1 \\ \text{rssi\_dig}_2, & P_1 < P < P_2 \\ \ldots \\ \text{rssi\_dig}_k, & P_{k-1} < P < P_k \end{cases} \quad (8)$$

For example, rssi_dig$_i$ is the received signal strength indication set in advance. As mentioned above, gain rssi_v of the intermediate frequency signal with respect to the received signal can be generated according to the automatic gain control coefficient and corresponding gain calculation, as shown below in formula (9).

$$\text{rssi}_v = AGC_{final} \times Gain \quad (9)$$

Figure 3:
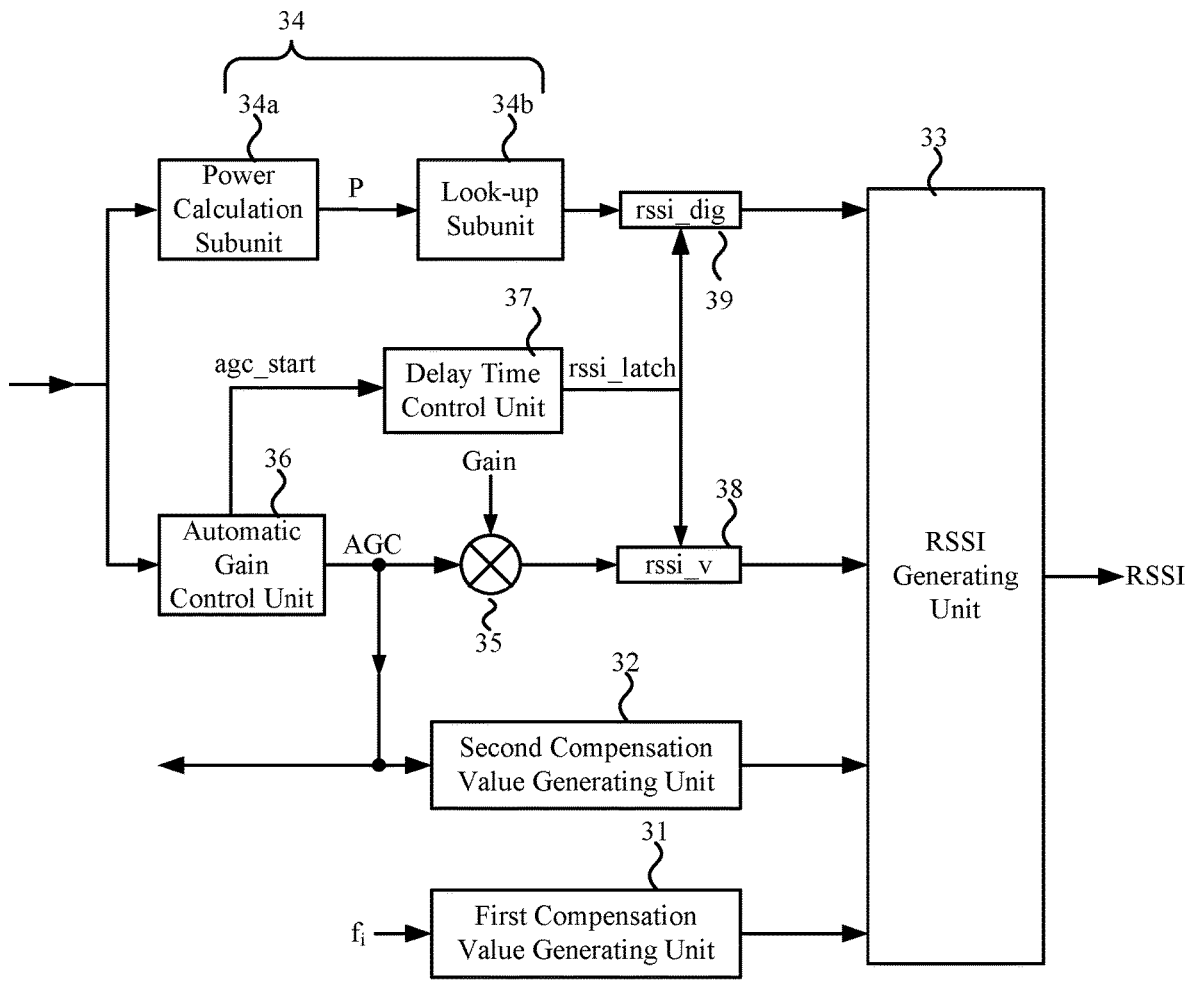
FIG. 3 is a schematic block diagram of an example device for generating a received signal strength indication, in accordance with embodiments of the present invention.

Referring now to FIG. 3, shown is a schematic block diagram of an example device for generating a received signal strength indication, in accordance with embodiments of the present invention. In this particular example, the generating device may be configured in digital receiving circuit 3, and the intermediate frequency digital signal may be received, in order to generate received signal strength indication RSSI. The generating device of the received signal strength indication can share a portion of circuitry with the other portions of digital receiving circuit 3.

In this example, the generating device of the received signal strength indication can include compensation generating unit 31, compensation generating unit 32, and received signal strength indication generating unit 33. Compensation generating unit 31 can generate compensation value offset based on a receiving frequency. Compensation generating unit 32 can generate compensation value offset_agc based on an automatic gain control coefficient. Compensation value offset can represent the attenuations of the wireless signal at different receiving frequencies during the transmission to the analog receiving circuit. Compensation value offset_agc can represent the gain errors that correspond to different automatic gain control coefficients.

The compensation values can compensate for the attenuations of the wireless signal during the transmission from the antenna to the analog receiving circuit, and for gain error of the automatic gain control loop. Received signal strength indication generating unit 33 can generate the received signal strength indication (RSSI) based on compensation values offset and offset_agc, the intermediate frequency signal strength, and the gain of the intermediate frequency signal with respect to the received signal. As mentioned above, the relationship of the frequency and compensation value offset, and the relationship of the automatic gain control coefficient and compensation value offset_agc can be set in advance in digital receiving circuit 3.

The generating device can also include intermediate frequency signal strength generating unit 34, which can generate the intermediate frequency signal strength according to the power of the intermediate frequency signal. For example, intermediate frequency signal strength generating unit 34 can include power calculation circuit 34a and look-up circuit 34b. Power calculation subunit 34a can calculate power P according to the digital intermediate frequency signal. Look-up sub-unit 34b can generate corresponding intermediate frequency signal strength rssi_dig according to the power range. Intermediate frequency signal strength rssi_dig may be provided to the received signal strength indication generating unit. Intermediate frequency signal strength generating unit 34 can employ other structures when the intermediate frequency signal strength may be calculated in other manners, and the generating device can share intermediate frequency signal strength generating circuit 34 with other blocks.

The generating device also can include gain generating unit 35 that can generate gain rssi_v of the intermediate frequency signal with respect to the received signal according to the automatic gain control coefficient of the automatic gain control loop. For example, gain generating unit 35 may be implemented by a multiplier, which can multiply automatic gain control coefficient AGC$_{final}$ and by the predetermined gain value Gain, in order to generate gain rssi_v of the intermediate frequency signal with respect to the received signal.

In addition, the generating device also can include automatic gain control unit 36 and delay time control unit 37. Automatic gain control unit 36 may be a part of the automatic gain control loop, which can receive the digital intermediate frequency signal, and may generate the automatic gain control coefficient according to the signal amplitude. The automatic gain control coefficient may be fed back to analog receiving circuit 2. Automatic gain control unit 36 can determine when a valid digital intermediate frequency signal is received based on the magnitude of the digital intermediate frequency signal. When the amplitude of the digital intermediate frequency signal is sufficiently large (e.g., when the digital intermediate frequency signal is valid), automatic gain control start signal agc_start can indicate the moment of receiving the valid signal.

Automatic gain control unit 36 can begin the automatic gain control operation when automatic gain control start signal agc_start is detected, and then the automatic control loop may enter into a stable state after a period of time. At the initial moment of the receiving state, automatic gain control unit 36 can set the initial value of the automatic gain control coefficient to be the maximum value. Thus, the gain level of analog receiving circuit 2 may be turned to the maximum value at the initial moment in order to prevent the relatively small wireless signal from being filtered as the gain is not large enough. When the valid signal arrives (e.g., the received wireless signal is valid or the digital intermediate frequency signal is valid), automatic gain control unit 36 can activate a valid automatic gain control start signal agc_start (e.g., agc_start may be set as 1), which may represent the automatic gain control stage being entered at this time.

Then, the automatic gain control coefficient may be adjusted according to the intermediate frequency signal, and further maintained at appropriate value $AGC_{final}$ after a period of adjustment. When the automatic gain control coefficient begins adjusting, the demodulation circuit in digital receiving circuit 3 can begin operating in order to demodulate the digital intermediate frequency signal, and to provide a demodulation result. Before the automatic gain control loop is stabilized, the system may not enter into the stable state, and errors in different links can be relatively large, which can render the calculated received signal strength indication useless. Therefore, delay time control unit 37 can enable gain generating unit 35 and intermediate frequency signal strength generating unit 34 by delaying a predetermined time after the automatic gain control start signal generated by automatic gain control unit 36 becomes valid.

In this way, gain generating unit 35 and intermediate frequency signal strength generating unit 34 can be prevented from operating during the adjustment stage of the automatic gain control, in order to reduce power consumption. For example, registers 38 and 39 can respectively be set for storing gain rssi_v of the intermediate frequency signal with respect to the received signal and intermediate frequency signal strength rssi_dig. Received signal strength indication generating unit 33 can receive gain rssi_v and intermediate frequency signal strength rssi_dig by reading the corresponding register through a data bus, and may generate the received signal strength indication (RSSI).

Figure 4:
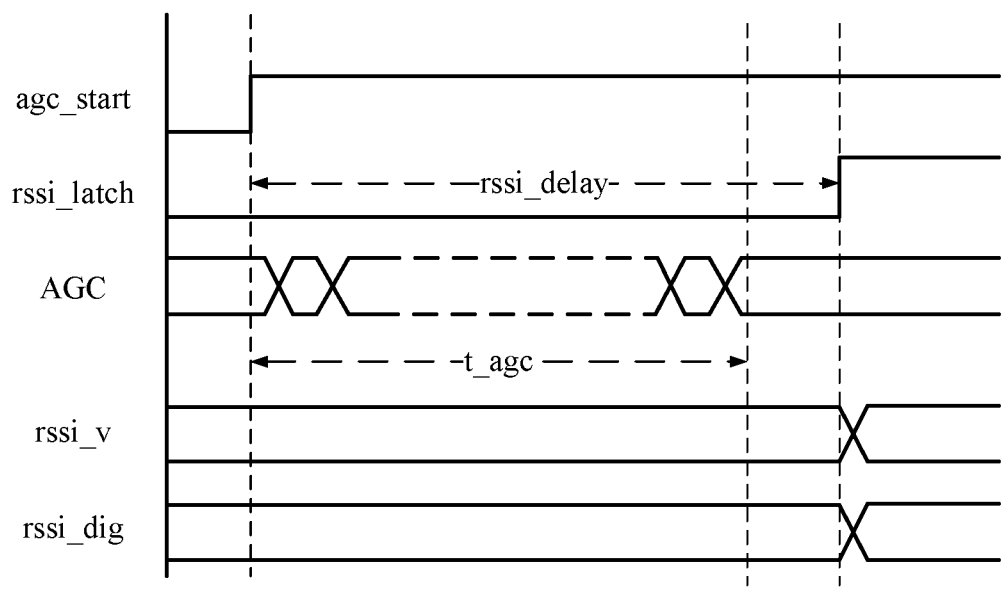
FIG. 4 is a waveform diagram of example operation of a generating device, in accordance with embodiments of the present invention.

Referring now to FIG. 4, shown is a waveform diagram of example operation of a generating device, in accordance with embodiments of the present invention. In this particular example, before the valid signal arrives, automatic gain control start signal agc_start may be kept at low level. Also, the automatic gain control coefficient may be maintained at the maximum value, and gain rssi_v of the intermediate frequency signal in register 38, and intermediate frequency signal strength rssi_dig in register 39, may be calculation results of the previous time. The valid signal may be deemed to arrive when the amplitude of the digital intermediate frequency signal is sufficiently large enough. Automatic gain control start signal agc_start may go high to start the automatic gain control, such that the digital intermediate frequency signal may be in the predetermined amplitude range. The automatic gain control loop may be stable after the adjustment of time period t_agc, and can be maintained at stable value $AGC_{final}$.

After automatic gain control start signal agc_start goes high, delay time control unit 37 may start-up a timer that outputs signal rssi_latch with its rising edge delaying agc_start for predetermined time rssi_delay. The signal may be used as enable signals of gain generating unit 35 and intermediate frequency signal strength generating unit 34, or enable signals of registers 38 and 39, in order to initiate the calculation and/or update of the gain rssi_v of the intermediate frequency signal with respect to the receiving signal and intermediate frequency signal strength rssi_dig. To ensure that the calculation or update of gain rssi_v of the intermediate frequency signal with respect to the received signal and intermediate frequency signal strength rssi_dig is performed after the automatic gain control loop is stabilized, delay time rssi_delay may be set to be greater than adjustment period t_agc of the automatic gain control loop.

The generating device and the components thereof in FIG. 3 can be implemented by wiring a plurality of circuits inside an integrated circuit or on a printed circuit. In addition, or alternatively, the modules or steps of particular embodiments can be implemented by a general data processing device. For example, the modules or steps can be integrated in one data process device, or distributed in a network formed by a plurality of data process devices. As another example, modules or steps can be implemented by program codes which may be executed by data processing devices, and the steps can be stored in a storage device and be executed by a computer device. Alternatively, the modules can be a plurality of integrated circuit devices, or some of the modules or steps can be implemented by one integrated circuit module.

Attenuations of the signal during the transmission from the antenna to the analog receiving circuit may be independent of the signal content, but related to the receiving frequency. Thus, the compensation value related to the attenuation may be generated based on the receiving frequency. Also, during the procedure of amplifying the signal by the analog receiving circuit, errors may exist between gains corresponding to different automatic gain control coefficients. Because the errors are independent of the signal content, but related to the automatic gain control coefficient, another compensation value related to the errors may be generated based on the automatic gain control coefficient. In this way, the attenuations and errors can be compensated by the two compensation signals, in order to improve the generating accuracy of the RSSI.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of controlling a digital receiving circuit having first and second compensation value generating circuits and a received signal strength indication generating circuit, the method comprising:

a) generating, by said first compensation value generating circuit, a first compensation value based on a receiving frequency, wherein said first compensation value represents attenuations of a wireless signal at different receiving frequencies during transmission from an antenna to an analog receiving circuit;

b) generating, by said second compensation value generating circuit, a second compensation value based on an automatic gain control coefficient generated by said digital receiving circuit and provided to said analog receiving circuit, wherein said second compensation value represents gain errors corresponding to different automatic gain control coefficients; and c) generating, by said received signal strength indication generating circuit, a received signal strength indication based on said first and second compensation values, an intermediate frequency signal strength, and a gain of said intermediate frequency signal with respect to a received signal.

2. The method of claim 1, further comprising generating said intermediate frequency signal strength based on an intermediate frequency signal.

3. The method of claim 2, wherein said generating said intermediate frequency signal strength comprises looking up a table based on said intermediate frequency signal.

4. The method of claim 1, further comprising generating said gain of said intermediate frequency signal with respect to said received signal on the basis of said automatic gain control coefficient of an automatic gain control loop.

5. The method of claim 1, further comprising generating said intermediate frequency signal strength and said gain of said intermediate frequency signal with respect to said received signal after a predetermined delay time after an automatic gain control loop has started, wherein said predetermined delay time is greater than an adjustment period of said automatic gain control loop.

6. A device comprising a digital receiving circuit having first and second compensation value generating circuits and a received signal strength indication generating circuit, wherein:

a) said first compensation generating circuit is configured to generate a first compensation value based on a receiving frequency, wherein said first compensation value represents attenuations of a wireless signal at different receiving frequencies during transmission from an antenna to an analog receiving circuit;

b) said second compensation generating circuit is configured to generate a second compensation value based on an automatic gain control coefficient generated by said digital receiving circuit and provided to said analog receiving circuit, wherein said second compensation value represents gain errors corresponding to different automatic gain control coefficients; and c) said received signal strength indication generating circuit is configured to generate a received signal strength indication based on said first and second compensation values, an intermediate frequency signal strength, and a gain of an intermediate frequency signal with respect to a received signal.

7. The device of claim 6, further comprising an intermediate frequency signal strength generating circuit configured to generate said intermediate frequency signal strength based on the power of said intermediate frequency signal.

8. The device of claim 7, wherein said intermediate frequency signal strength generating circuit comprises:

a) a power calculation circuit configured to calculate said power of said intermediate frequency signal; and b) a look-up circuit configured to generate said intermediate frequency signal strength by looking up a correspondence table based on said power of said intermediate frequency signal.

9. The device of claim 7, further comprising a gain generating circuit configured to calculate and generate, in accordance with said automatic gain control coefficient of an automatic gain control loop, said gain of said intermediate frequency signal with respect to said received signal.

10. The device of claim 9, further comprising a delay time control circuit configured to enable said gain generating circuit and said intermediate frequency signal strength generating circuit after a predetermined delay time after said automatic gain control loop has started, wherein said predetermined delay time is greater than an adjustment period of said automatic gain control loop.

\* \* \* \* \*